(12) United States Patent
Hoeks et al.

(10) Patent No.: US 7,092,231 B2
(45) Date of Patent: Aug. 15, 2006

(54) CHUCK, LITHOGRAPHIC APPARATUS AND DEVICE MANUFACTURING METHOD

(75) Inventors: Martinus Hendricus Hendricus Hoeks, Breugel (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/643,167

(22) Filed: Aug. 19, 2003

(65) Prior Publication Data

US 2004/0114124 A1    Jun. 17, 2004

(30) Foreign Application Priority Data

Aug. 23, 2002    (EP) ................... 02255915

(51) Int. Cl.
*H02N 13/00* (2006.01)
*G03B 27/58* (2006.01)
*G03B 27/62* (2006.01)

(52) U.S. Cl. ............... 361/234; 355/72; 355/75

(58) Field of Classification Search ........... 355/53, 355/72–76; 361/234
See application file for complete search history.

(56) References Cited

U.S. PATENT DOCUMENTS

| | | | |
|---|---|---|---|
| 4,384,918 A | 5/1983 | Abe | |
| 4,502,094 A | 2/1985 | Lewin et al. | 361/234 |
| 4,551,192 A | 11/1985 | Di Milia et al. | |
| 5,160,152 A | 11/1992 | Toraguchi et al. | 279/128 |
| 5,350,479 A | 9/1994 | Collins et al. | |
| 5,777,838 A * | 7/1998 | Tamagawa et al. | 361/234 |
| 5,841,624 A * | 11/1998 | Xu et al. | 361/234 |
| 5,880,924 A * | 3/1999 | Kumar et al. | 361/234 |
| 5,885,469 A | 3/1999 | Kholodenko et al. | |
| 5,923,408 A | 7/1999 | Takabayashi | 355/53 |
| 6,388,861 B1 * | 5/2002 | Frutiger | 361/234 |
| 6,452,775 B1 * | 9/2002 | Nakajima | 361/234 |
| 6,754,062 B1 * | 6/2004 | Logan et al. | 361/234 |
| 2002/0101956 A1 | 8/2002 | Hara et al. | 378/34 |

FOREIGN PATENT DOCUMENTS

| | | |
|---|---|---|
| EP | 0720217 A2 | 7/1996 |
| EP | 0803904 A2 | 10/1997 |
| EP | 1059566 A2 | 12/2000 |
| JP | 6314735 | 11/1994 |
| JP | 10107132 | 4/1998 |
| JP | 11251417 | 9/1999 |
| JP | 20000183146 | 6/2000 |
| JP | 200201471 | 7/2000 |
| JP | 2003-296503 | 11/2005 |
| WO | WO98/57361 | 12/1998 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is provided with an electrostatic chuck. The electrostatic chuck includes a dielectric element which has a plurality of pins formed on a first surface. The item to be clamped is clamped in position on the chuck by applying a potential difference between an electrode located on the surface of the dielectric member opposite to the clamping surface and an electrode located on the clamping surface of the item to be clamped. The pins are provided with at least an upper conducting layer, which serves to reduce the Johnsen-Rahbek effect, allowing the substrate to be released more quickly.

23 Claims, 4 Drawing Sheets

CHUCK, LITHOGRAPHIC APPARATUS AND DEVICE MANUFACTURING METHOD

This application claims priority from European patent application EP 02255915.7 filed Aug. 23, 2002, herein incorporated in its entirety by reference.

FIELD

The present invention relates to a chuck for use in holding an object.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application publication WO 98/40791, which are incorporated herein by reference.

In a lithographic apparatus it is essential that the substrate is held securely on the substrate table. The position of the substrate is required to be known accurately, even when the table undergoes high accelerations. In a conventional lithographic apparatus it is known to provide this clamping by means of a vacuum. The substrate table is provided with protrusions or pins and an outer wall. The substrate sits on top of these pins and the space behind it is evacuated. The action of air pressure on the surface on the substrate then serves to hold it securely in place. Further details of such a substrate holder can be found, for example, in European patent application EP-A-0 947 884, incorporated herein in its entirety by reference.

While such a clamp is effective in many applications, recent developments in lithography require the use of EUV (extreme ultraviolet) radiation, x-rays, electrons or ions. Unlike conventional lithography in which UV radiation is employed, EUV techniques require that the beam path, or at least a substantial part of the beam path, is evacuated. The vacuum clamping method is then less effective.

It has been proposed to provide a system of clamping for use in a lithographic apparatus which uses electrostatic forces to clamp the substrate to the substrate table. Such a system will work regardless of the presence of a vacuum on both sides of the substrate. In such a system, the substrate is either conductive, or provided with a conductive electrode on the surface which is to be attached to the substrate table. An electrostatic chuck comprises of one or more electrodes. On top of the electrodes a layer of dielectric material is placed. The top surface of this layer is usually patterned to reduce the contact area between substrate and chuck. A potential difference between the electrode and the substrate (mono-polar design) or between the two or more electrodes in the chuck itself (bi-polar and multi-polar design) is set to generate an electro-static force to clamp the substrate to the chuck.

Typically, the dielectric will have a polished smooth surface. However, in a practical situation the surface of the substrate and the dielectric will never be perfectly smooth and will contain small variations. Furthermore, although the resistivity of the dielectric is extremely high (greater than $10^8 \Omega m$) a small leakage current will flow. This leads to the creation of Johnsen-Rahbek (JR) forces additional to the capacitive electrostatic force. These forces arise due to the flow of the leakage current between points where the substrate and dielectric are in contact. At points where the substrate and dielectric are not in contact, charge builds up and creates an additional JR force. When the potential difference is removed, the stored charge creating the JR force takes time to dissipate, and introduces a delay before the substrate can be released from the chuck. It has been proposed to apply a reverse voltage in the release stage in order to dissipate the charge more quickly. It has also been proposed to cycle the polarity of the applied voltage to minimize the charge build-up. However a relatively high cycle frequency is required and complicated schemes are required to maintain the clamping force at all times.

Accordingly, it would be advantageous to provide a chuck in which the Johnsen-Rahbek effect may be minimized, allowing greater throughput of substrates.

SUMMARY

In an aspect of at least one embodiment of the present invention, there is provided a chuck for use in holding an object onto a supporting table by electrostatic force, the object being at least one of a substrate to be processed in manufacturing devices employing lithographic protection techniques; and a lithographic projection mask or mask blank in a lithographic projection apparatus, a mask handling apparatus such as mask inspection or cleaning apparatus, or a mask manufacturing apparatus; the chuck comprising a dielectric member, wherein on the side of the dielectric member which is facing the object, the dielectric member is provided with a plurality of pins, at least each of the pins having at least a conductive layer formed on the surface which is in contact with the object, the conductive layer having a specific resistivity less than 10 $\Omega$m.

An advantage of such a chuck is that the effect of the JR forces is reduced. The presence of the conductive layer eliminates JR forces in all places where the pins are in contact with the substrate. Furthermore, the surface of the dielectric member apart from the pins is located a sufficient distance away from the substrate that the Johnsen-Rahbek force is negligible. The actual area of the pins in contact with the substrate is minimal, so the overall electrostatic force is only very slightly smaller than if the dielectric member were flat. In this way the substrate is clamped effectively by electrostatic force under an applied potential difference and can be released quickly when the potential difference is removed.

Advantageously, the conductive layer is less than 200 nm thick. Having a thin coating will ease the control of the flatness of the chuck. Furthermore a standard CVD process can be used to manufacture this layer.

Advantageously, the conductive layer may not be a metal. If a metal is used then metal atoms can diffuse into the substrate at the points of contact and destroy the semiconducting properties.

The pins may be formed of conducting pins, which penetrate the entire depth of the dielectric member, the pins being connected to a conducting member. An electrode is provided in the dielectric member such that it is not in contact with the pins or the conducting member. Therefore, the substrate may be grounded and Johnsen-Rahbek forces will not occur when the substrate is clamped by applying a voltage to the electrode.

Advantageously, the thickness of the dielectric member is 50–200 µm. This allows sufficient depth to form the structure of pins, and provides an optimal distance over which the electrostatic force may operate, without the risk of breakdown in the dielectric member.

Advantageously, the total area of pins can be kept to less than 4% of the total area of the dielectric member. This helps ensure that any effects on the electrostatic force due to the contact between the conducting layer of the pins and the substrate is reduced.

In an advantageous configuration, the pins project 2–10 µm from the dielectric member. This distance is sufficient to render the Johnsen-Rahbek effect negligible over those areas of the dielectric member without pins. Furthermore, the mechanical properties of the pins when a clamping force is applied are improved due to their relatively small height.

The pins may be between 0.15 mm to 0.5 mm in diameter, and spaced between 2 to 15 mm apart. This ensures a large area of the dielectric member does not contain pins, and thus is effective for generating an electrostatic clamping force. It also means that the diameter of the pins is greater than their height, enhancing their mechanical properties. Furthermore, by providing the pins at 2 to 15 mm spacing an even force can be applied while supporting the whole area of the substrate. Any distortion of the substrate under clamping is therefore reduced. The dielectric member will typically have hundreds or thousands of pins, ensuring that at least some are in contact with the substrate.

In another aspect of at least one embodiment of the present invention, there is provided a lithographic projection apparatus comprising:
  an illuminator configured to supply a projection beam of radiation;
  a support structure configured to hold a patterning device, the patterning device configured to pattern the projection beam according to a desired pattern;
  a substrate table configured to hold a substrate;
  a projection system configured to project the patterned beam onto a target portion of the substrate;
  a chuck, as described above on, at least one of the support structure and the substrate table; and
  at least a first electrode for applying a potential difference across the dielectric member of the chuck thereby to generate a clamping force.

In another aspect of at least one embodiment of the present invention, there is provided a device manufacturing method comprising:
  providing a substrate that is at least partially covered by a layer of radiation-sensitive material;
  providing a projection beam of radiation;
  using a patterning device to endow the projection beam with a pattern in its cross-section; and
  projecting the patterned beam of radiation onto a target portion of the layer of radiation-sensitive material, wherein the first surface of the dielectric member has a plurality of pins, each of the pins having at least a conductive layer formed on the upper outer surface, the conductive layer having a specific resistivity of less than 10 Ωm.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
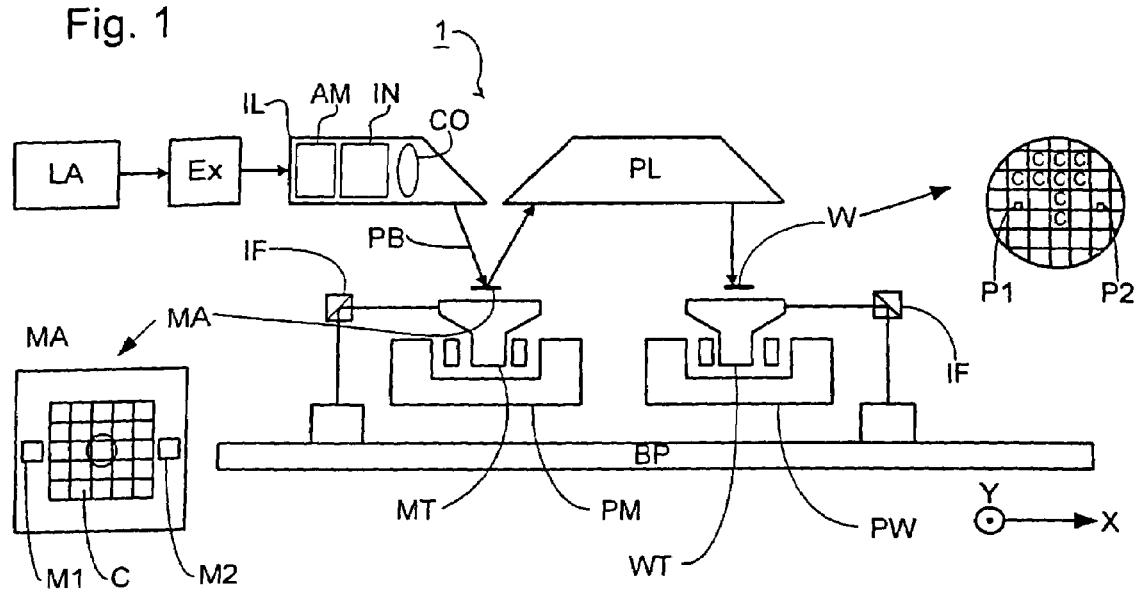
FIG. 1 depicts a lithographic projection apparatus according to an embodiment of the invention.

FIG. 1 schematically depicts a lithographic projection apparatus according to a particular embodiment of the invention. The apparatus comprises:
  a radiation system Ex, IL, for supplying a projection beam PB of radiation (e.g. EUV radiation), which in this particular case also comprises a radiation source LA;
  a first object table (mask table) MT provided with a mask holder for holding a mask MA (e.g. a reticle), and connected to first positioning means for accurately positioning the mask with respect to item PL;
  a second object table (substrate table) WT provided with a substrate holder for holding a substrate W (e.g. a resist-coated silicon wafer), and connected to second positioning means for accurately positioning the substrate with respect to item PL;
  a projection system ("lens") PL (e.g mirror group) for imaging an irradiated portion of the mask MA onto a target portion C (e.g. comprising one or more dies) of the substrate W. As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

It has been noted above that an EUV system requires that a beam path is evacuated. This may be achieved by a single vacuum system which encloses the entire apparatus, or by several separate interlinked vacuum systems.

Figure 2:
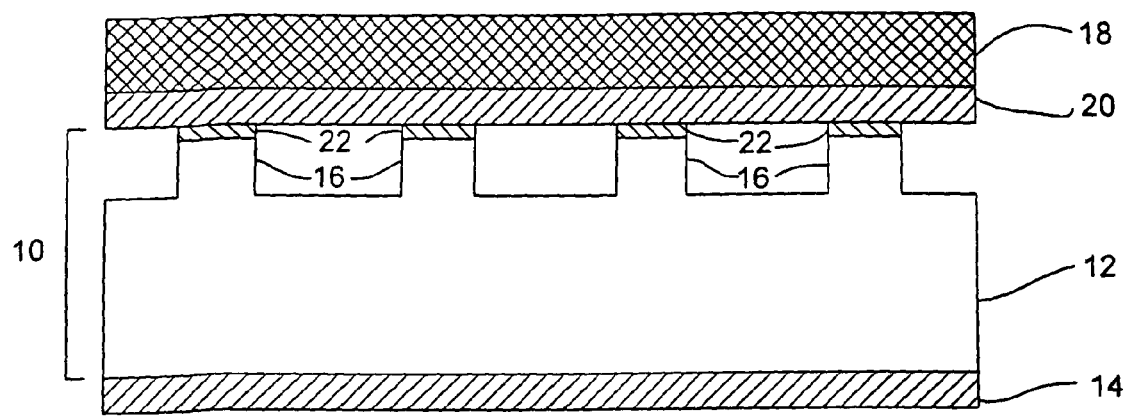
FIG. 2 depicts a chuck in accordance with a first embodiment of the present invention.

FIG. 2 illustrates the chuck 10 used according to an embodiment of the invention. The chuck 10 comprises a dielectric member 12 with an electrode 14 formed on one surface. On the opposite side of the dielectric member 12 to the electrode 14 a plurality of pins 16 are formed. These pins 16 are 0.3 mm in diameter and rise above the surface of the dielectric member 12 by 5 μm. The top 100 nm of each pin 16 is formed as a conductive layer. The conductive layer is, for example, TiN.

The chuck of the present embodiment is used to clamp a substrate 18. The substrate 18 is non-conductive, so an electrode 20 is formed on its clamping surface. When it is desired to clamp the substrate 18 using the chuck 10 a potential difference is applied between the electrodes 20 and 14. The capacitive effect produces an electrostatic force which clamps the substrate 18 to the chuck 10. It will be appreciated that the portions of the electrode 20 which are in contact with the upper conducting layer 22 of the pins 16 will not function as a capacitor. Here the direct connection between two conducting surfaces allows charge to flow freely and prevents the creation of Johnsen-Rahbek forces. Because the pins account for only a small proportion (0.5% to 4%) of the area of the dielectric member 12 the electrostatic force is reduced only by a small amount.

It cannot be assumed that the surface of electrode 20 is perfectly smooth, so not all the conducting layers 22 will be in contact with the electrode 20. In these areas there will be a small gap (of the order of 10 nm) in which the Johnsen-Rahbek effect may occur. However, because the capacitance of the conducting layer is very small, the force is also very small. The Johnsen-Rahbek effect will still occur in the surface of the dielectric member 12 which does not have pins 16 present. However, the 5 μm spacing between this surface and the top of the pins 16 ensures that Johnsen-Rahbek forces in this area are negligible.

It will be appreciated that while the above embodiment describes a non-conducting substrate 18 formed with an electrode 20, a conducting substrate (not illustrated) could be used. There would then be no need to form the electrode 20. In this situation a potential difference would be applied between the conducting substrate and the electrode 14. Furthermore, it will be appreciated that the chuck 10 may be permanently or removably attached to a substrate table (not illustrated).

Thus, it is possible to achieve an electrostatic clamping which is not influenced by the Johnsen-Rahbek effect. This allows throughput of substrates to be increased because there is no delay introduced while waiting for the Johnsen-Rahbek force to subside to a level where the substrate can be released from the clamp after the potential difference is removed.

It is still possible that if the polarity of the electrodes 14 and 20 is kept constant charge may build up and the Johnsen-Rahbek effect may become important. As described above the design of the chuck 10 minimizes the effect. However, to eliminate any potential build up of the Johnsen-Rahbek effect it is possible to alternate the polarity of voltages applied to the electrodes 20 and 14 each time the substrate is changed. This ensures that no charge builds up in the dielectric member 12. Furthermore, no complicated control techniques are required to reverse the polarity while the substrate is clamped. While it is advisable to alternate the voltage every time the wafer is changed, the effect of the Johnsen-Rahbek force has been found to be so small that a cycle in which the plurality is alternated over a longer period of time, up to two hours, is also suitable.

Embodiment 2

Figure 3:
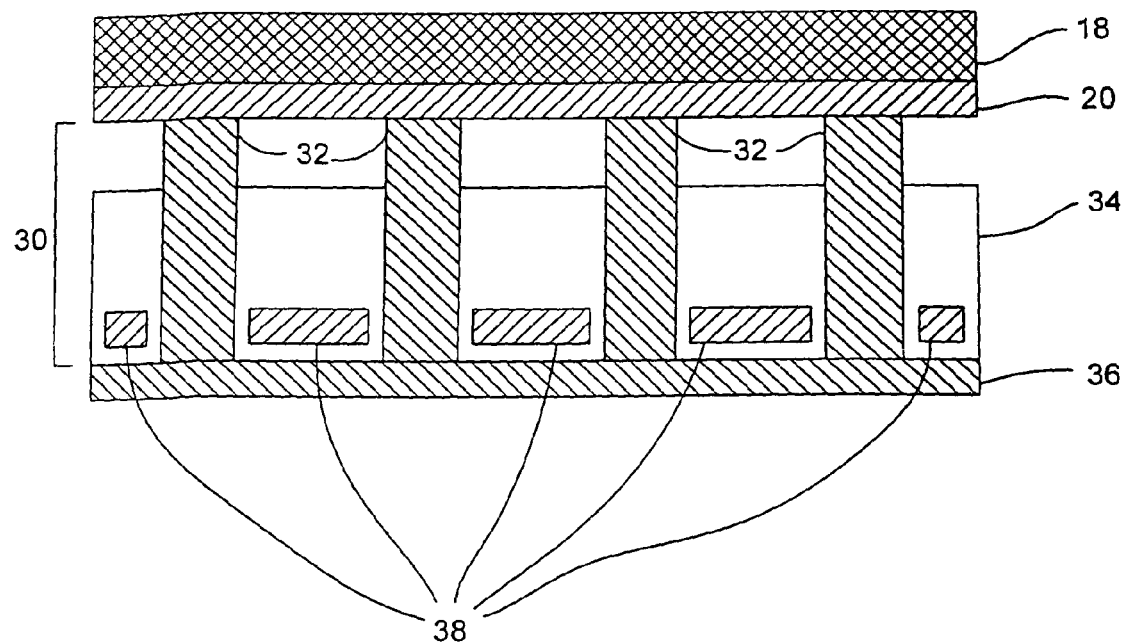
FIG. 3 depicts a chuck in accordance with a second embodiment of the present invention.

FIG. 3 illustrates the clamping chuck 30 according to a second embodiment of the present invention, which is the same as the first embodiment, save as described below. The chuck 30 is provided with a number of pins 32, similar to grounding pins, which extend through the entire depth of a dielectric member 34. The pins 32 are formed by a conductive material. The conducting pins 32 are connected to a conductor 36 which is disposed on the side of the chuck 30 which is not used for clamping a substrate 18. An electrode 38 is provided in the dielectric member 34 away from the clamping surface and insulated from both the pins 32 and the conductor 36 by the dielectric member 34.

The chuck of the second embodiment clamps the substrate 18 when a voltage is applied to the electrodes 38. It is possible that, in this embodiment, the substrate 18 is grounded. However, it is still advisable to alternate the applied voltage in a similar fashion to the first embodiment.

The dimensions and arrangement of the projecting parts of the pins in the second embodiment are the same as those of the pins in the first embodiment, so will not be described again.

Embodiment 3

Figure 4:
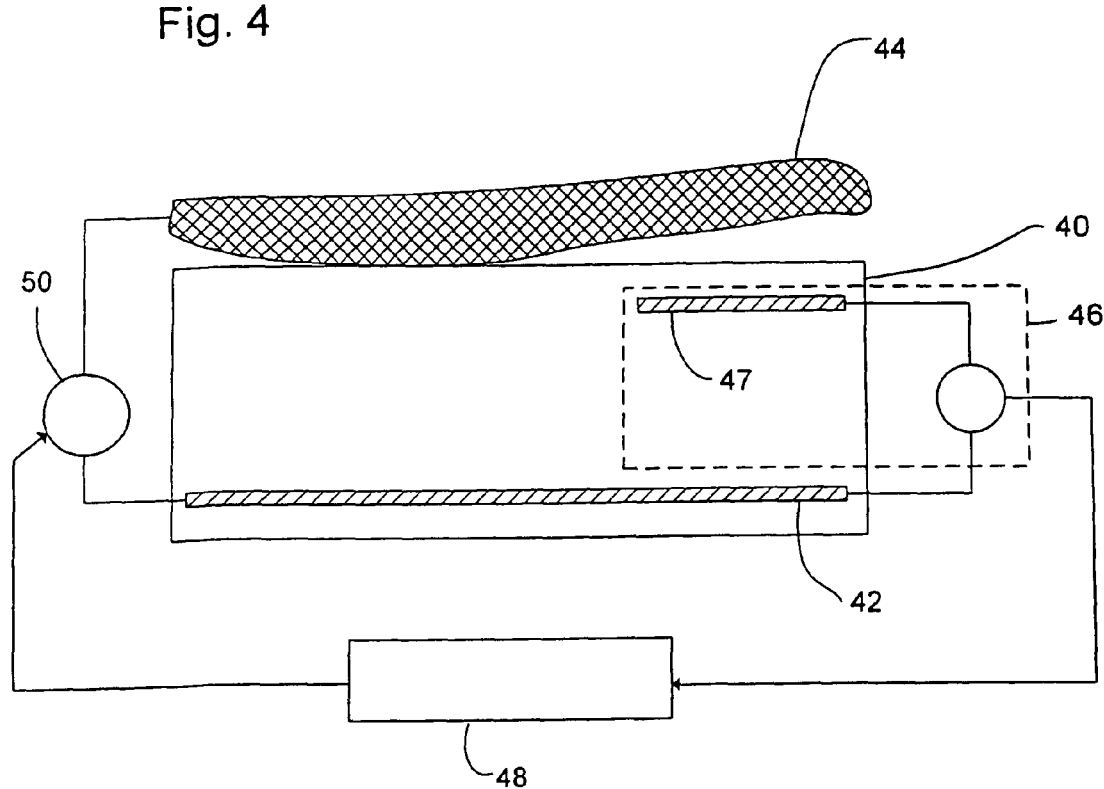
FIG. 4 illustrates a chuck and associated control circuitry in schematic format of a third embodiment of the present invention.

A third embodiment of a clamping chuck is illustrated in FIG. 4 in which the scale of microscopic surface variations on the substrate 44 has been exaggerated. The third embodiment is the same as the first embodiment, save as described below. While the aforementioned first and second embodiments have minimized the effects of Johnsen-Rahbek forces to enable a substrate to be released quickly when the clamping potential difference is removed, the third embodiment aims to control the Johnsen-Rahbek forces to a manageable level. It is then possible to benefit from the additional Johnsen-Rahbek force, and minimize any delay introduced during the clamping/declamping process. In the third embodiment the clamping surface of the dielectric member 40 is preferably polished flat. However, it will be appreciated that the clamping surface does not have to be polished flat.

An electrode 42 is provided on the surface of the dielectric member 40 which is opposite the clamping surface. To clamp a substrate 44 a potential difference is applied between the electrode 42 and the substrate 44. The third embodiment comprises a dielectric member 40; at least a first electrode 42; a voltage source 50 for providing a voltage between the first electrode and a substrate; a sensor 46 for sensing charge migration within the dielectric member 40; and control system 48 for controlling the voltage source 50 based on the output of the sensor 46.

As the potential difference is applied between the substrate 44 and the electrode 42, the charge within the dielectric begins to migrate. This reduces the effective distance and causes the Johnsen-Rahbek effect in areas where, due to microscopic surface variations of the substrate 44, the substrate 44 is not in contact with the dielectric member 40.

However, in this embodiment a sensor 46 is provided to measure the charge migration within the dielectric member 40. The sensor 46 includes an upper short electrode 47 within the dielectric member 40. This is processed by a control system 48 using a closed loop method to control the applied potential difference. The Johnsen-Rahbek force can therefore be controlled closely, and limited to a value which will subside when the potential difference is removed minimizing the delay before the substrate is released. Thus, it is possible to benefit from the increased clamping force created by the Johnsen-Rahbek effect while also minimizing any delay in releasing the substrate when the potential difference is removed. It will be appreciated that the control system 48 may apply a reverse voltage in the release phase to dissipate the stored charge as quickly as possible.

In the third embodiment, and as illustrated in FIG. 4, a conducting substrate 44 is used. However, a non-conducting substrate with an electrode on the clamping surface could be used instead, as described in relation to the above first and second embodiments. Furthermore, the control system and sensor of the third embodiment may be applied to the above first and second embodiments.

Embodiment 4

The above described first to third embodiments have considered mono-polar chucks. The fourth embodiment uses a bipolar chuck. The construction of the fourth embodiment is the same as the first embodiment, save as described below.

Figure 5:
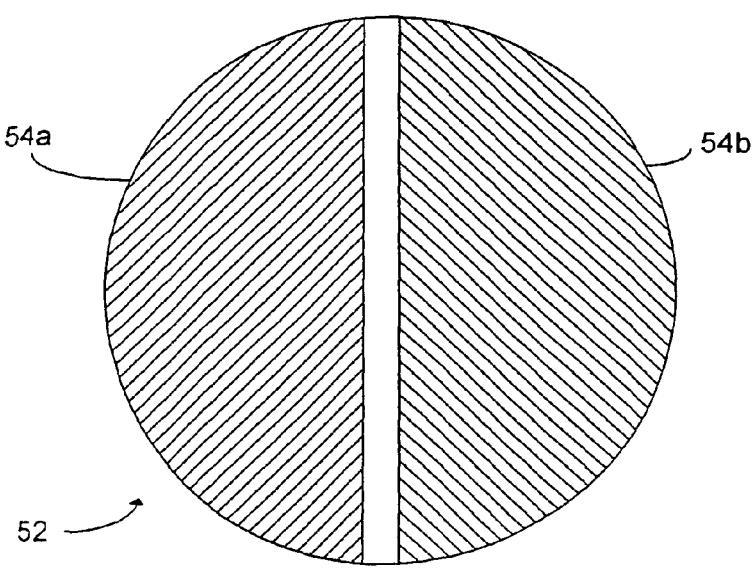
FIG. 5 is a plan view of the electrode pattern of a bipolar chuck according to a fourth embodiment of the present invention.

A plan view of the electrodes of a bipolar chuck 52 is illustrated in FIG. 5. The circular chuck 52 has two semicircular electrodes 54*a* and 54*b* instead of the single electrode 14 of the first embodiment. When it is desired to clamp a substrate to the chuck 52, a voltage of +100V is applied to one electrode and −100V to the other; the substrate will then be at zero potential.

There is therefore no requirement to use a conducting substrate or a substrate with a conducting layer. Consequently no electrical connections to the substrate is required.

Other structures of the bipolar design are possible, for example, the two electrodes may comprise an arrangement of interlocking fingers, a Greek key pattern, concentric rings or concentric spirals. A multi-polar design may also be used.

It will be appreciated that the electrode of the fourth embodiment may also be applied to the second or third embodiments, removing the requirement for a conducting substrate or a substrate with a conducting layer.

Embodiment 5

Figure 6:
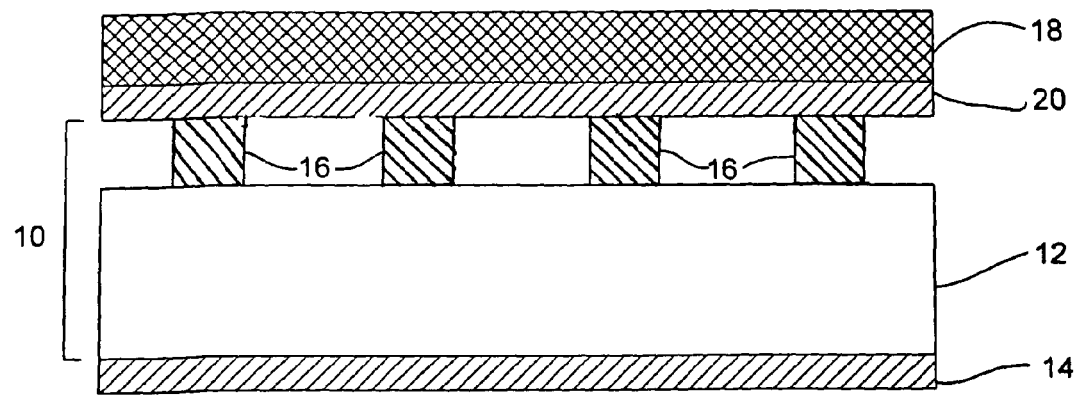
FIG. 6 depicts a chuck in accordance with a fifth embodiment of the present invention.

A fifth embodiment of a clamping chuck is illustrated in FIG. 6. The fifth embodiment is the same as the first embodiment, save as described below. The chuck 10 again comprises a dielectric member 12 with an electrode 14 formed on one surface. On the opposite side of the dielectric member 12 a number of pins 16 are formed. Contrary to the first embodiment, the pins 16 are conducting pins 16 which are mounted on the surface of the dielectric member 12 facing the electrode 20.

The dimensions and arrangement of the projecting parts of the pins 16 in the fifth embodiment are the same as those of the pins in the first embodiment and will therefore not be described again.

Embodiment 6

Figure 7:
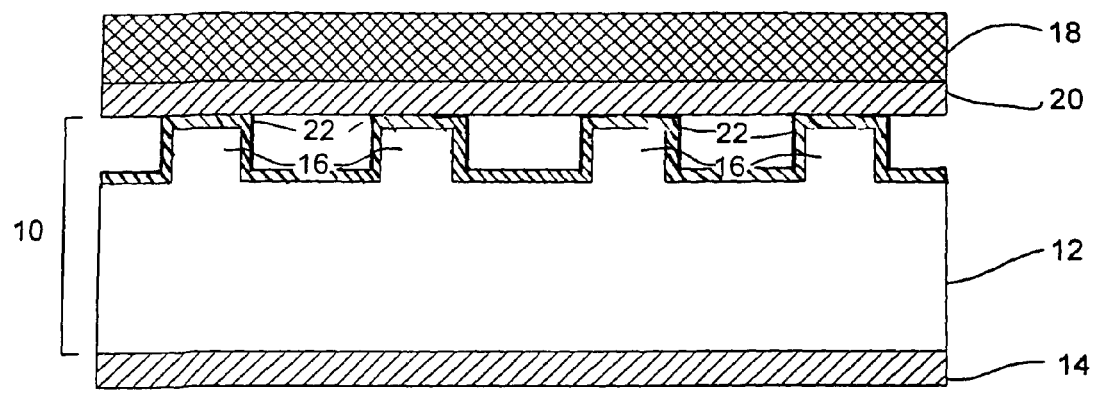
FIG. 7 depicts a chuck in accordance with a sixth embodiment of the present invention.

A sixth embodiment of a clamping chuck is illustrated in FIG. 7. The fifth embodiment is the same as the first embodiment, save as described below. In the sixth embodiment, the conductive layer 22 is also provided on the area between the respective pins 16. Therefore the area of the dielectric member 12 facing the electrode 20 is completely covered by the conductive layer 22.

While specific embodiments of the invention have been described above, it will be appreciated that the invention may be practiced otherwise than as described. The description is not intended to limit the invention.

What is claimed is:

1. A chuck to hold an object by electrostatic force, the chuck comprising a dielectric member, the side of the dielectric member facing the object provided with a plurality of pins having a conductive layer on the surface in contact with the object, the conductive layer having a specific resistivity less than 10 $\Omega$m.

2. A chuck according to claim 1, wherein the conductive layer is less than 200 nm thick.

3. A chuck according to claim 1, wherein the conductive layer is non-metallic.

4. A chuck according to claim 1, wherein the pins are conducting pins which penetrate the depth of the dielectric member and are connected to a conducting member.

5. A chuck according to claim 1, wherein the pins are conducting pins mounted on the surface of the dielectric member facing the object.

6. A chuck according to claim 1, wherein the thickness of the dielectric member is 50 to 200 μm.

7. A chuck according claim 1, wherein the surface area of the pins which is in contact with the object is less than 4% of the total area of the dielectric member.

8. A chuck according to claim 1, wherein the pins project 2 to 10 μm from the surface of the dielectric member.

9. A chuck according to claim 1, wherein the pins are between 0.15 mm to 0.5 mm in diameter.

10. A chuck according to claim 1, wherein the pins are 2 to 15 mm apart.

11. A chuck according to claim 1, wherein the surface of the dielectric member facing the object is provided with a conductive layer.

12. A chuck according to claim 1, wherein the object is at least one of:
a substrate used in lithographic projection techniques; and
a lithographic projection mask or mask blank in at least one of a lithographic projection apparatus, a mask handling apparatus, and a mask manufacturing apparatus.

13. A chuck according to claim 4, further comprising an electrode configured to create a potential difference across the dielectric member of the chuck to generate a clamping force, the electrode insulated from the conducting pins and the conducting member.

14. A chuck according to claim 1, further comprising an electrode configured to create a potential difference across the dielectric member of the chuck to generate a clamping force.

15. A chuck according to claim 14, wherein the electrode is configured to alternate a polarity of the potential difference across the dielectric member to reduce charge build up.

16. A chuck according to claim 15, wherein the electrode is configured to change the polarity each time an object is clamped to the chuck.

17. A chuck according to claim 1, further comprising a sensor configured to measure a charge migration within the dielectric member.

18. A chuck according to claim 17, wherein the sensor comprises an electrode within the dielectric member and a controller configured to control an applied potential difference across the dielectric member.

19. A chuck according to claim 1, further comprising a control system configured to provide a reverse potential difference when the object is released from the chuck to dissipate built up charge.

20. A chuck according to claim 1, further comprising a first electrode configured to create a positive potential difference across the dielectric member of the chuck and a second electrode configured to create a substantially equal but negative potential difference across the dielectric member of the chuck.

21. A chuck according to claim 20, wherein the chuck is of substantially circular shape and the first and second electrodes are substantially semi-circular.

22. A chuck according to claim 20, wherein the first and second electrodes are configured in an arrangement of interlocking fingers, a Greek key pattern, concentric rings or concentric spirals.

23. A chuck according to claim 1, further comprising a conductive layer disposed on the side of the dielectric member facing the object but not configured to be in contact with the object.

* * * * *